US007421671B2

(12) United States Patent
Korobkov (10) Patent No.: US 7,421,671 B2
(45) Date of Patent: Sep. 2, 2008

(54) GRAPH PRUNING SCHEME FOR SENSITIVITY ANALYSIS WITH PARTITIONS

(75) Inventor: Alexander Korobkov, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 141 days.

(21) Appl. No.: 11/469,460

(22) Filed: Aug. 31, 2006

(65) Prior Publication Data

US 2008/0059922 A1 Mar. 6, 2008

(51) Int. Cl.
*G06F 17/50* (2006.01)
(52) U.S. Cl. .................................. 716/5; 716/7; 703/16
(58) Field of Classification Search ............... 716/5, 716/7; 703/16
See application file for complete search history.

(56) References Cited

U.S. PATENT DOCUMENTS

| 5,502,645 | A  | * | 3/1996  | Guerra et al. ............ 716/18 |
| 6,014,505 | A  | * | 1/2000  | Schorn .................... 716/3  |
| 6,243,614 | B1 | * | 6/2001  | Anderson ................ 700/108 |
| 6,324,679 | B1 | * | 11/2001 | Raghunathan et al. ..... 716/18  |
| 6,721,924 | B2 | * | 4/2004  | Patra et al. ............. 716/2  |
| 6,813,761 | B1 | * | 11/2004 | Das et al. ............... 717/132 |
| 2003/0066037 | A1 | * | 4/2003  | Patra et al. ............ 716/2  |
| 2004/0060016 | A1 | * | 3/2004  | Patra et al. ............ 716/2  |
| 2005/0050497 | A1 | * | 3/2005  | Tetelbaum .............. 716/6   |
| 2005/0235232 | A1 | * | 10/2005 | Papanikolaou et al. ..... 716/1  |
| 2007/0057732 | A1 | * | 3/2007  | Chang et al. ............ 330/303 |

FOREIGN PATENT DOCUMENTS

JP        2003087311 A  *  3/2003

OTHER PUBLICATIONS

Agarwal et al., "Statistical Clock Skew analysis Considering Intra-Die Process Variations", 2003 International Conference on Computer-Aided Design, Nov. 9-13, 2003, pp. 914-921.*

(Continued)

*Primary Examiner*—Phallaka Kik
(74) *Attorney, Agent, or Firm*—Martine Penilla & Gencarella, LLP (57) ABSTRACT

A method of analyzing a circuit simulation comprising pruning a signal flow graph. Pruning the signal flow graph includes selecting a current vertex from a multiple input vertices in the signal flow graph. Each one of the input vertices is connected to a primary input of the signal flow graph. Determining if the current vertex includes at least one of a sensitivity parameter or a sensitivity variable. If the current vertex includes at least one of a sensitivity parameter or a sensitivity variable then the current vertex is identified as being part of a sensitivity path and is added to a first sub-group of vertices. Pruning the signal flow graph also includes determining if any remaining non-visited neighbor vertices remain to be analyzed. If any remaining non-visited neighbor vertices remain to be analyzed then selecting a neighboring vertex and determining if the selected neighbor vertex is identified as a sensitivity path. If the selected neighbor vertex is identified as a sensitivity path, then the first sub-group of vertices are output into a final pruned signal flow graph. A system for simulating and analyzing a circuit is also disclosed.

19 Claims, 7 Drawing Sheets

OTHER PUBLICATIONS

Catalano et al., "Exploring the Ability of Oscillation Based Test for Testing Continuous-Time Ladder Filters", 7th International Symposium on Quality Electronic Design, Mar. 27-29, 2006, pp. 1-6.*

Deng et al., "An Exact Algorithm for the Statistical Shortest Path Problem", Asia and South Pacific Conference on Design Automation, Jan. 24-27, 2006, pp. 965-970.*

Kuo et al., "Offset Current Cancellation Based on a Multiple-Path Feedback Compensation (MPFC) Technique for Switched-Current Circuits and Systems", IEEE Transactions on Circuits and Systems II: Analog and Digital Signal Processing, vol. 44, No. 4, pp. 299-309.*

Xiong et al., "Criticality Computation in Parameterized Statistical Timing", 2006 43rd ACM/IEEE Design Automation Conference, Jul. 24-28, 2006, pp. 63-68.*

Glebov et al., "Delay Noise Pessimism Reduction by Logic Correlations", IEEE/ACM International Conference on Computer Aided Design, Nov. 7-11, 2004, pp. 160-167.*

Harris et al., "Statistical Clock Skew Modeling with Data Delay Variations", IEEE Transactions on Very Large Scale Integration (VLSI) Systems, vol. 9, No. 6, pp. 888-898.*

Neves et al., "Optimal Clock Skew Scheduling Tolerant to Process Variations", 33rd Design Automation Conference Proceedings, Jun. 3-7, 1996, pp. 623-628.*

Ohashi et al., "Statistical Schedule Length Analysis in Asynchronous Data Path Synthesis", IEEE International Symposium on Circuits and Systems, vol. 1, May 23-26, 2005, pp. 700-703.*

Pullela et al., "Moment-Sensitivity-Based Wire Sizing for Skew Reduction in On-Chip Clock Nets", IEEE Transactions on Computer-Aided Design of International Circuits and Systems, vol. 16, No. 2, pp. 210-215.*

Velenis et al., "A Clock Tree Topology Extraction Algorithm for Improving the Tolerance of Clock Distribution Networks to Delay Uncertainty", 2001 IEEE International Symposium on Circuits and Systems, vol. 4, May 6-9, 2001, pp. 422-425.*

Wei et al., "Clock Skew Scheduling Under Process Variations", 7th International Symposium on Quality Electronic Design, Mar. 27-29, 2006, pp. 1-6.*

NN7308804, "Computer Assisted Design of Program Test Libraries", IBM Technical Disclosure Bulletin, vol. 16, No. 3, Aug. 1973, pp. 804-807 (pages).*

* cited by examiner

GRAPH PRUNING SCHEME FOR
SENSITIVITY ANALYSIS WITH PARTITIONS

BACKGROUND

The present invention relates generally to simulations of electronic circuits, and more particularly, to methods and systems for performing sensitivity analysis of simulations of semiconductor circuits.

Silicon design technology is approaching 65 nanometer and ever smaller feature size. The number of transistors is growing exponentially as the feature size gets smaller. As a result there is a growing demand in high performance electronic design automation (EDA) software tools that can perform the ultra-large size transistor level electrical circuit verification in the reasonable amount of time. One of the most challenging issues coming with 65 nm and smaller feature sizes is accounting for on-chip process parameter variations to predict the entire system yield and manufacturability. Process parameter variations result in variations in device parameters (e.g., width, length, depth, etc.) that are impact performance of the device.

The promising approach to address the ultra-large size transistor level electrical circuit verification in the reasonable amount of time uses a statistical analysis. However, statistical analysis has been applied mostly in the timing analysis area where direct operations on probability functions are available. Statistical circuit simulation traditionally provides more accurate results at the expense of performance. Statistical simulation is normally done using a well-known Monte-Carlo Analysis which can be applied to the systems of limited complexity due to its runtime constraints.

A promising approach is statistical simulation based on the sensitivity analysis. With process parameters partially correlated this type of analysis usually gives accurate results with performance significantly improved with respect to Monte-Carlo analysis. However the typical combination of statistical simulation and Monte-Carlo analysis yields performance that is still not acceptable for very large scale circuits and the netlists (i.e., the interconnections and circuit and device descriptions) because the resulting process is too complex and too slow to run in simulation. In view of the foregoing, there is a need for an improved, pared down combination of statistical simulation and Monte-Carlo analysis.

SUMMARY

Broadly speaking, the present invention fills these needs by providing a improved, pared down combination of statistical simulation and Monte-Carlo analysis. It should be appreciated that the present invention can be implemented in numerous ways, including as a process, an apparatus, a system, computer readable media, or a device. Several inventive embodiments of the present invention are described below.

One embodiment provides a method of analyzing a circuit simulation comprising pruning a signal flow graph. Pruning the signal flow graph includes selecting a current vertex from a multiple input vertices in the signal flow graph. Each one of the input vertices is connected to a primary input of the signal flow graph. Determining if the current vertex includes at least one of a sensitivity parameter or a sensitivity variable. If the current vertex includes at least one of a sensitivity parameter or a sensitivity variable then the current vertex is identified as being part of a sensitivity path and is added to a first sub-group of vertices. Pruning the signal flow graph also includes determining if any remaining non-visited neighbor vertices remain to be analyzed. If any remaining non-visited neighbor vertices remain to be analyzed then selecting a neighboring vertex and determining if the selected neighbor vertex is identified as a sensitivity path. If the selected neighbor vertex is identified as a sensitivity path, then the first sub-group of vertices are output into a final pruned signal flow graph.

If the current vertex does not include at least one of a sensitivity parameter or a sensitivity variable then determining if the first sub-group of vertices is empty and if the first sub-group of vertices is empty then adding the current vertex to the first sub-group of vertices. If the first sub-group of vertices is empty and if the first sub-group of vertices is not empty, then determining if any remaining non-visited neighbor vertices remain to be analyzed.

If no remaining non-visited neighbor vertices remain to be analyzed then the first sub-group of vertices can be output into the final pruned signal flow graph. If the selected neighbor vertex is not identified as a sensitivity path, then the neighboring vertex can be set as the current vertex. The neighbor vertex can include a second vertex connected to the current vertex with no intervening vertices.

The signal flow graph can be pruned in a single traversal of the signal flow graph. The single traversal of the signal flow graph can be a forward traversal of the signal flow graph.

The method can also include inputting a netlist to a simulation, decomposing the netlist, building a ordered signal flow graph from the decomposed netlist, pruning the signal flow graph iteratively for each one of the plurality of input vertices and outputting the final pruned signal flow graph.

Another embodiment provides a method of analyzing a circuit simulation including inputting a netlist to a simulation, decomposing the netlist, building a ordered signal flow graph from the decomposed netlist and pruning the signal flow graph iteratively for each one multiple input vertices. The signal flow graph is pruned in a single forward direction traversal of the signal flow graph including selecting a current vertex from multiple input vertices in the signal flow graph, wherein each one of the plurality of the input vertices is connected to a primary input of the signal flow graph, determining if the current vertex includes at least one of a sensitivity parameter or a sensitivity variable. If the current vertex includes at least one of a sensitivity parameter or a sensitivity variable then identifying the current vertex as being part of a sensitivity path and adding the current vertex to a first sub-group of vertices. The remaining non-visited neighbor vertices are examined to determine if any of the remaining non-visited neighbor vertices remain to be analyzed. A non-visited neighbor vertex is selected and determining if the selected neighbor vertex is identified as a sensitivity path. If the selected neighbor vertex is identified as a sensitivity path, then the first sub-group of vertices are output into a final pruned signal flow graph. The final pruned signal flow graph is output.

Yet another embodiment provides a circuit simulation and analysis system including a hardware portion to support the simulation, the hardware including a microprocessor, a storage medium capable of storing data and microprocessor readable instructions including a plurality of applications. The circuit simulation and analysis system includes logic for pruning a signal flow graph including logic for selecting a current vertex from multiple input vertices in the signal flow graph. Each one of the input vertices is connected to a primary input of the signal flow graph. Logic for determining if the current vertex includes at least one of a sensitivity parameter or a sensitivity variable. If the current vertex includes at least one of a sensitivity parameter or a sensitivity variable then identifying the current vertex as being part of a sensitivity path and adding the current vertex to a first sub-group of vertices and logic for determining if any remaining non-visited neighbor vertices remain to be analyzed, wherein if any remaining non-visited neighbor vertices remain to be analyzed then selecting a neighboring vertex and determining if the selected neighbor vertex is identified as a sensitivity path, wherein if the selected neighbor vertex is identified as a sensitivity path, then the first sub-group of vertices are output into a final pruned signal flow graph.

The system can also include an input portion, logic for inputting a netlist to a simulation, logic for decomposing the netlist, logic for building a ordered signal flow graph from the decomposed netlist and logic for pruning the signal flow graph iteratively for each one of the input vertices. An output portion is also included and logic for outputting the final pruned signal flow graph.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION

Several exemplary embodiments for an improved, pared down combination of statistical simulation and Monte-Carlo analysis will now be described. It will be apparent to those skilled in the art that the present invention may be practiced without some or all of the specific details set forth herein.

As described above, the typical combination of statistical simulation and Monte-Carlo analysis yields performance that is still not acceptable for very large-scale circuit netlists because the resulting process is too complex and too slow to run in simulation. To improve statistical simulation performance, sensitivity analysis can be used as an alternative, to replace multiple simulation runs with one nominal simulation run and one sensitivity analysis run per sensitivity parameter, due to the fact that sensitivity analysis is normally less complex than ordinary simulation, when combined with the nominal simulation run and/or fast simulation techniques like partitioning and event-driven analysis. One approach to improve sensitivity analysis performance is to decompose or partition circuit netlist into non-overlapping parts, where each part can be represented as vertex in a directed graph then apply sensitivity analysis to each vertex rather then the entire netlist. This improves performance significantly while maintaining reasonable accuracy. Due to the number of sensitivity parameters close to the number of devices in the netlist the existing algorithms can be further improved to provide an acceptable performance by an advanced pruning of the graph in a pre-processing stage. The advanced graph pruning scheme is proposed to achieve near linear complexity which makes it possible to run circuit sensitivity analysis on the netlists with millions of transistors.

The transistor level circuit simulation engine includes three major features contributing into the performance: simplified transistor model, partitioning and event-driven simulation. The purpose of sensitivity analysis is to calculate circuit the variations in device variables (e.g., node voltage and device current) caused by variations in circuit parameters (e.g., device length, width, resistor, temperature, etc.). With respect to sensitivity analysis both partitioning and event-driven simulation features can provide significant performance advantage.

In the described approach, each vertex is submitted for simulation separately, including taking input data from other vertices previously simulated. The results are transferred to other vertices and procedure is repeated until convergence criteria are satisfied based on the employed relaxation scheme. Some vertices are eliminated from consideration sensitivity parameters and variable dependency between different vertices are considered.

Embodiments of the present invention improve performance of the sensitivity analysis that can be incorporated into a fast transistor level circuit simulation tool. Embodiments of the present invention can also perform statistical simulation more efficiently with the ultra-large electrical circuit netlists. The process proposed in the embodiments of the present invention performs signal flow graph traversal only once for the entire set of sensitivity variables and sensitivity parameters. This improves the overall simulation tool performance and therefore improves design cycle for ultra-high density transistor level circuit netlists. Many other approaches perform the entire signal flow graph traversal for each sensitivity parameter thus making it unwieldy, slow and complex to use with complex circuit netlists where the number of sensitivity parameters approach the total number of circuit devices. One embodiment compares a derivative of a selected sensitivity variable to a derivative of a selected sensitivity parameter.

Figure 1:
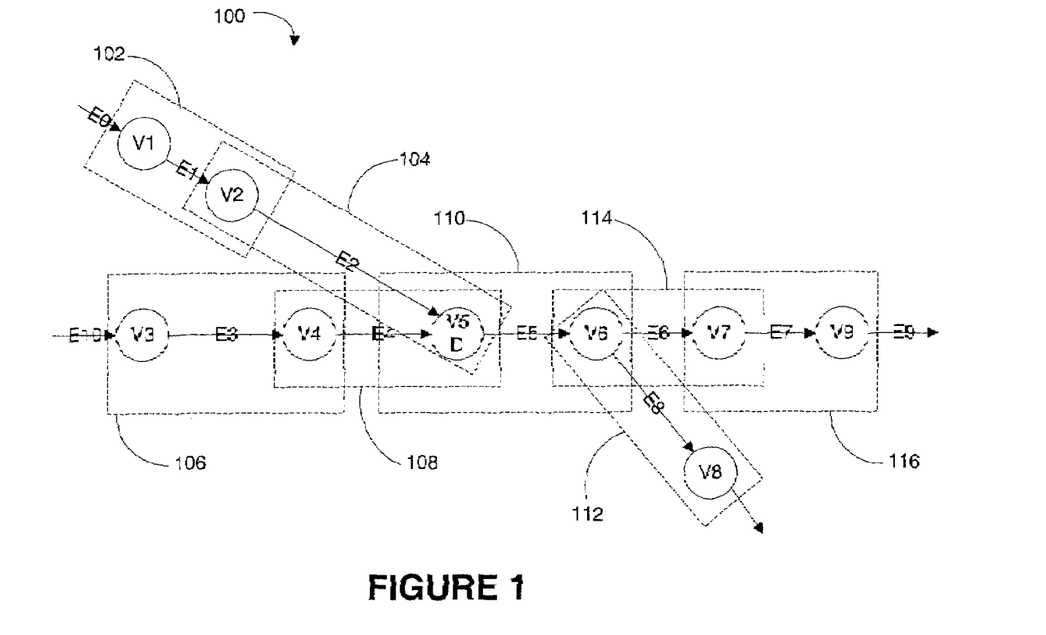
FIG. 1 is an example of a portion of a signal flow graph of a circuit simulation, in accordance with an embodiment of the present invention.

FIG. 1 is an example of a portion of a signal flow graph 100 of a circuit simulation, in accordance with an embodiment of the present invention. The entire circuit simulated as a directed graph G={V, E}. The signal flow graph 100 includes multiple vertices V1-V9. The vertices V1-V9 correspond to sub-circuits and edges E0-E10 correspond with the connection between the output of one sub-circuit and input of another sub-circuit. By way of example, edge E2 represents the edge between the output of vertex V2 and the input of vertex V5.

Figure 2A:
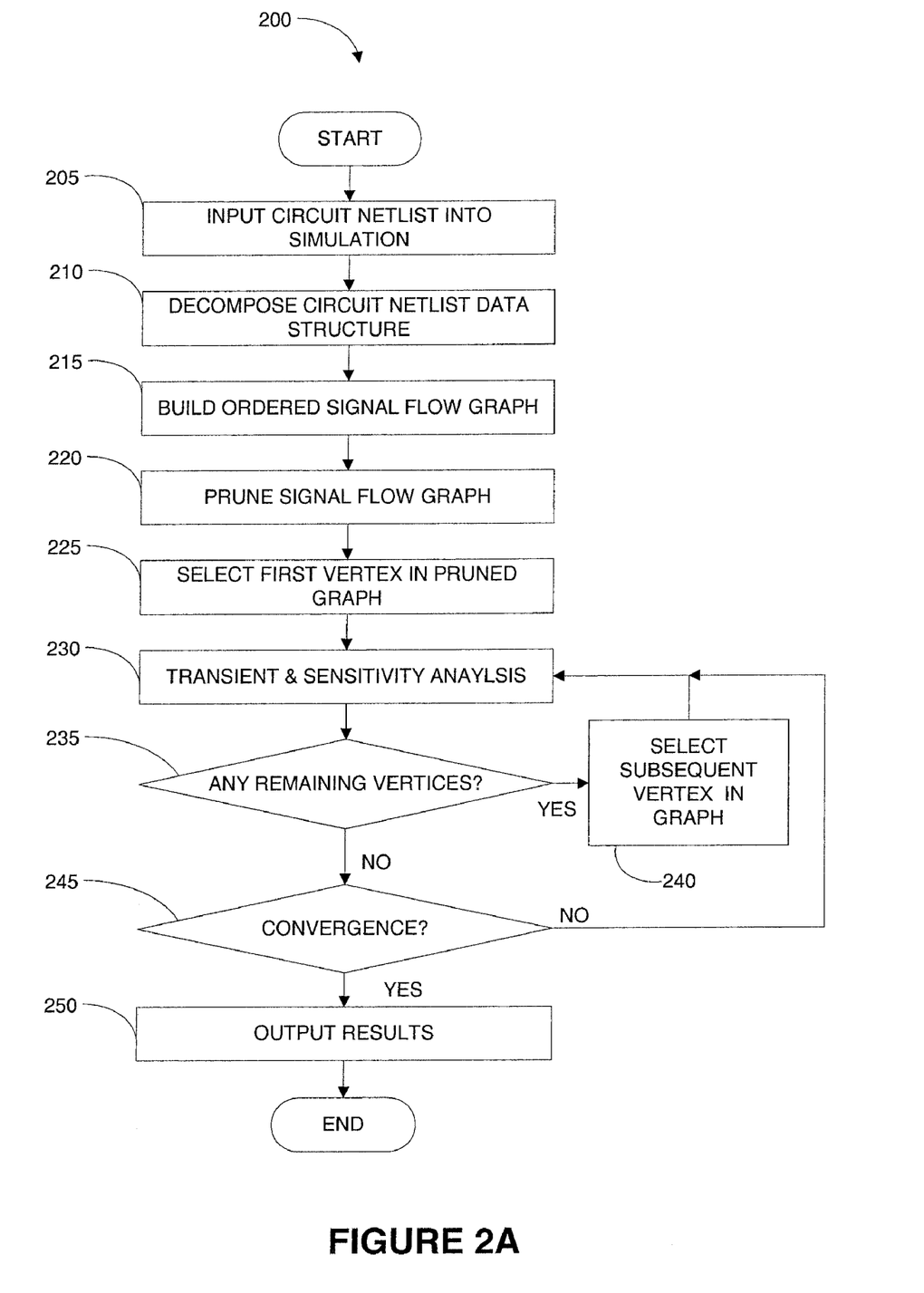
FIG. 2A is a flowchart diagram that illustrates the method operations performed in a simulation of a netlist represented in signal flow graph, in accordance with an embodiment of the present invention.

FIG. 2A is a flowchart diagram that illustrates the method operations 200 performed in a simulation of a netlist represented in signal flow graph 100, in accordance with an embodiment of the present invention. The analysis of the signal flow graph 100 identifies relationships between sensitivity variables and sensitivity parameters. In an operation 205 the circuit netlist is input to a circuit simulation. In an operation 210, the circuit netlist is decomposed into a data structure for collecting the simulation data.

In an operation 215, the signal flow graph 100 is formed to logically represent the signal flow through the netlist. To capture sensitivity parameters and circuit variable dependencies the pruning scheme first traverses signal flow graph 100 forward starting from each vertices V1-V9. Each of the vertices V1-V9 contains one or more sensitivity parameters. Traversing the signal flow graph 100 begins with the inputs to the signal flow graph and continues through each of the vertices V1-V9 collects the traversed vertices and edges into the corresponding signal flow graph 100.

In an operation 220, the signal flow graph 100 is partitioned into vertices V1-V9. Dividing the signal flow graph 100 into vertices V1-V9 can also include pruning (i.e., removing from the analysis) some of the vertices that do not meet the requirements for the analysis. Operation 220 is described in more detail in FIG. 2B below.

In an operation 225, a first vertex in the graph 100 is selected for analysis. By way of example, vertex V3 can be selected.

In an operation 230 a transient analysis is applied to all of the vertices and sensitivity analysis is applied only to selected vertices. The transient and sensitivity analysis is described in more detail below. In an operation 235, if any remaining vertices remains to be analyzed, and in operation 240, the subsequent vertex is selected for analysis as described in operation 230 above.

If in operation 235 no additional vertices remain to be analyzed then the method operations continue in an operation 245. In operation 245, the analyzed vertices are analyzed for convergence.

If there is no convergence then the method operations continue in operation 230 as described above. The convergence is present in operation 245, then in operation 250, the results are output.

Figure 2B:
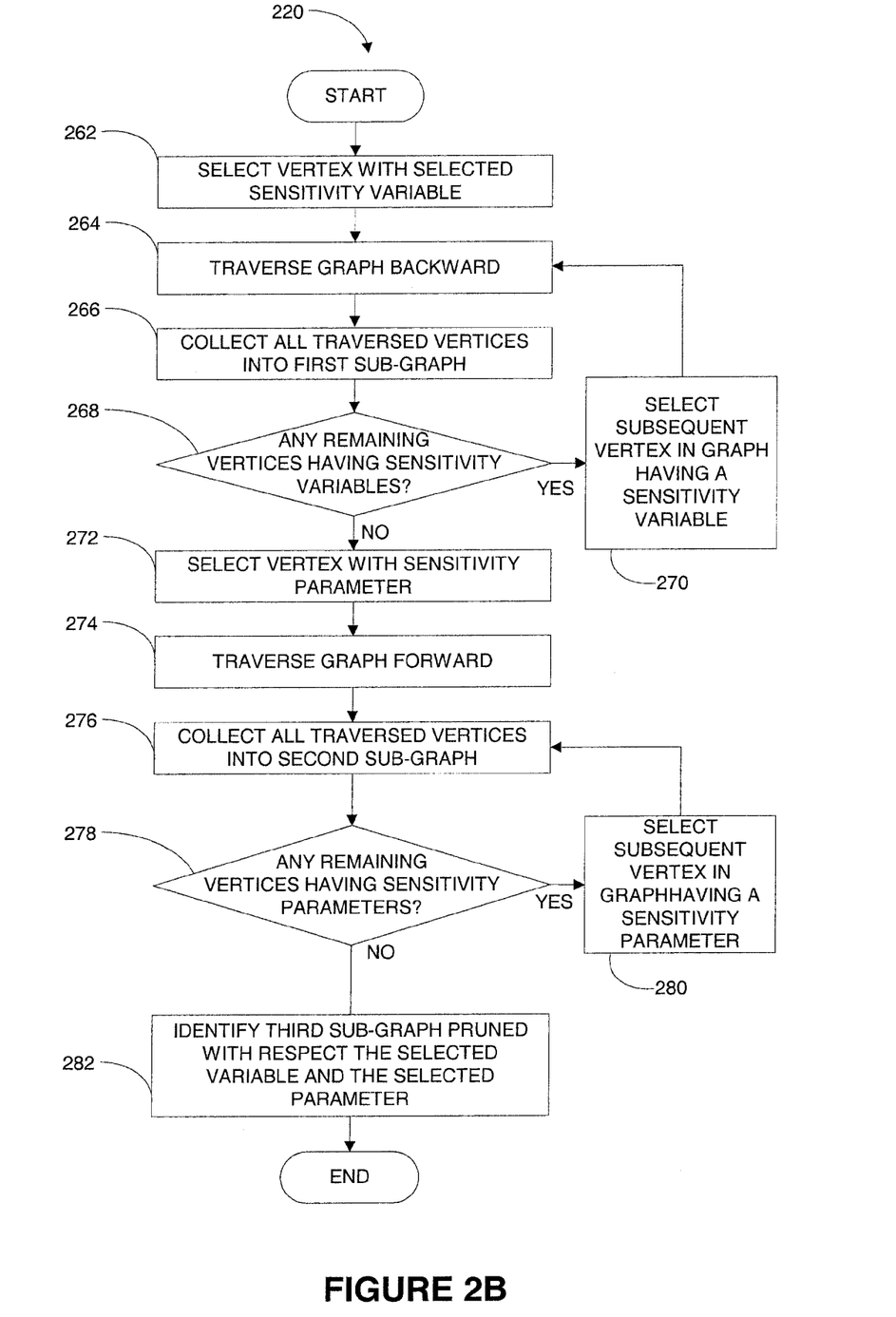
FIG. 2B is a flowchart diagram that illustrates the method operations performed in pruning the signal flow graph, in accordance with an embodiment of the present invention.

FIG. 2B is a flowchart diagram that illustrates the method operations 220 performed in pruning the signal flow graph 100, in accordance with an embodiment of the present invention. A single traversal is performed for each and every sensitivity parameter. The single traversal can be a forward or reverse direction traversal. A forward direction traversal is described herein but one skilled in the art would readily understand that a reverse direction traversal could similarly be used.

In an operation 262, the selected vertex V5 has a selected sensitivity parameter "D" and a selected sensitivity variable is a voltage at the output of vertex V5.

In an operation 264 the signal flow graph 100 is traversed backward starting with the sensitivity variable of the voltage at the output of vertex V5. In an operation 266, the vertices V3, V4, V5 and V6 and edges E3, E4 and E5 are collected into a first sub-graph for analysis.

In an operation 268, the signal flow graph 100 is reviewed to determine if any remaining vertices having sensitivity variables remain. If any remaining vertices having sensitivity variables remain, then the method operations continue in operation 270 where a subsequent vertex with a sensitivity variable is selected and the method operations continue in operation 264 as described above. In this manner the signal flow graph is analyzed for each sensitivity variable.

If, in operation 268 no vertices having sensitivity variables remain, then the method operations continue in an operation 272. In operation 272 a vertex with a selected sensitivity parameter is selected. In an operation 274, the signal flow graph 100 is traversed in a forward direction from the selected vertex and in an operation 276, all of the traversed vertices are collected in a second sub-graph.

In an operation 278, the signal flow graph 100 is reviewed to determine if any remaining vertices having sensitivity parameters remain. If any remaining vertices having sensitivity parameters remain, then the method operations continue in operation 280 where a subsequent vertex with a sensitivity parameter is selected and the method operations continue in operation 276 as described above. In this manner the signal flow graph is analyzed for each sensitivity parameter.

If, in operation 278 no vertices having sensitivity parameters remain, then the method operations continue in an operation 282. In operation 282 a third sub-graph is identified as the intersection of the first sub-graph and the second sub-graph. This third sub-graph is the pruned graph used for analysis in operation 225 of FIG. 2A as described above.

In order to improve pruning scheme performance for the large scale circuit netlists it is beneficial to traverse signal flow graph only once. The single traversal can be in the forward or reverse direction. A forward direction traversal is described herein but one skilled in the art would readily understand that a reverse direction traversal could similarly be used. The single traversal can identify all dependencies during the single traversal. The enhanced signal flow graph pruning process uses a depth first search (DPS) approach. The signal flow graph 100 traversal is performed starting with each vertex connected to the primary inputs then connected vertices are analyzed recursively until all vertices are examined. Each vertex can be marked as "visited" and as "sensitivity path". An new sub-graph for the candidates is initially created and the final pruned graph created. A vertex is copied into the new sub-graph based on certain conditions. The vertices are promoted from candidates to the members of final pruned graph once the sensitivity path is identified. The proposed pruning approach provides complexity close to linear and improves performance significantly, especially in the cases with large number of sensitivity parameters and small number of sensitivity variables.

Figure 3:
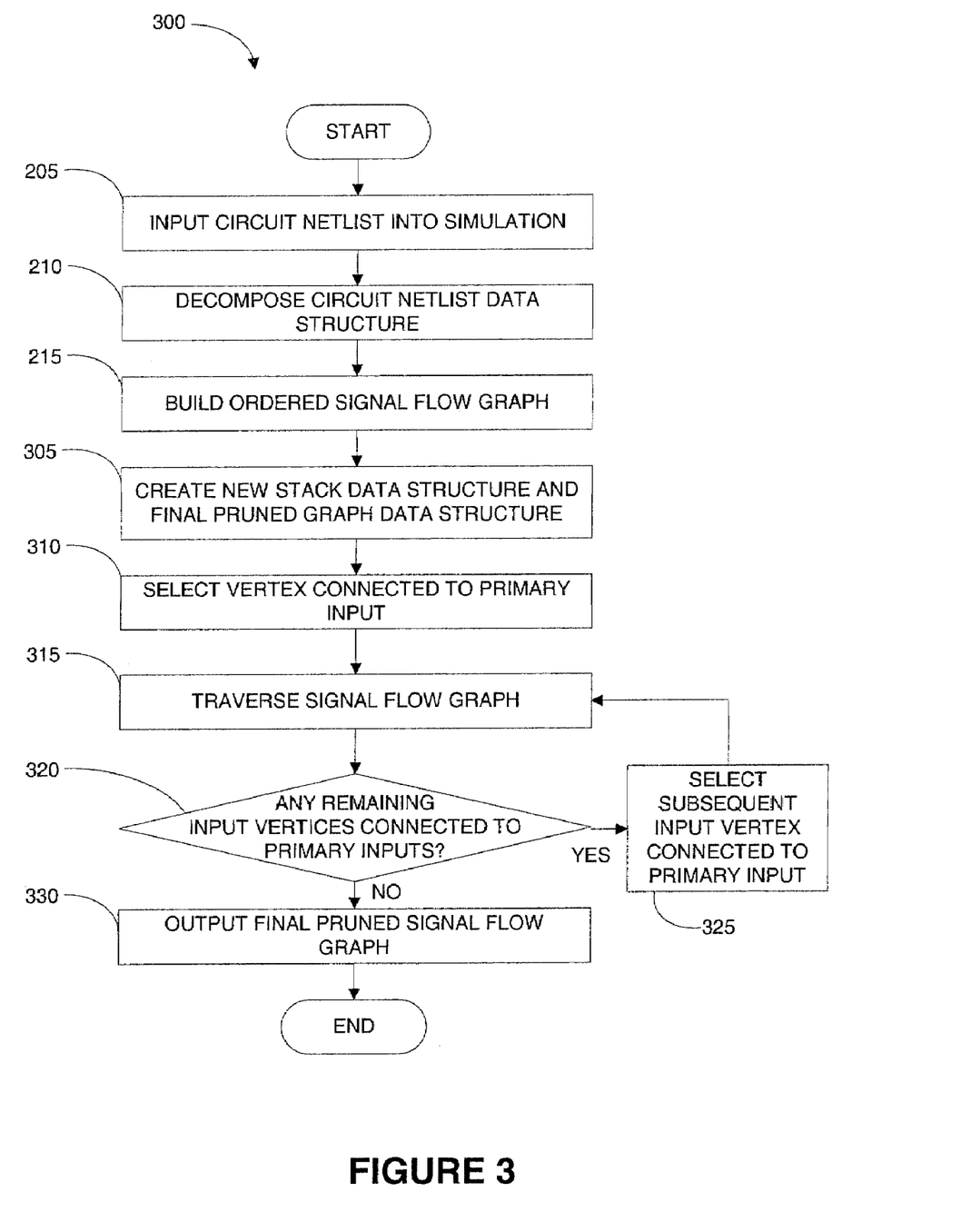
FIG. 3 is a flowchart diagram that illustrates the method operations performed in a simulation of a netlist represented in signal flow graph, in accordance with an embodiment of the present invention.

FIG. 3 is a flowchart diagram that illustrates the method operations 300 performed in a simulation of a netlist represented in signal flow graph 100, in accordance with an embodiment of the present invention. In an operation 205 the circuit netlist is input to a circuit simulation. In an operation 210, the circuit netlist is decomposed into a data structure for collecting the simulation data.

In an operation 215, the signal flow graph 100 is formed to logically represent the signal flow through the netlist. To capture sensitivity parameters and circuit variable dependencies the pruning scheme first traverses signal flow graph 100 forward starting from each vertices V1-V9. Each of the vertices V1-V9 contains one or more sensitivity parameters. Traversing each of the vertices V1-V9 collects the traversed vertices and edges into the corresponding signal flow graph 100.

In an operation 305, a new stack data structure and a final pruned graph data structure are created. In an operation 310 a vertex connected to a primary inputs is selected. By way of example, the signal flow graph 100 has two primary inputs at E0 and E10 as inputs to vertices V1 and V3 respectively. Therefore either of vertex V1 or V3 can be selected in operation 310.

In an operation 315 the signal flow graph 100 is traversed to identify the vertices that are in a sensitivity path connected to the selected primary input vertex. By way of example, if vertex V1 is selected, then the signal flow graph 100 is traversed in a forward direction to analyze vertices V1, V2, V5, V6, V7, V9 and V8. Additional details of the traversal operation 315 are described in FIG. 4A below.

In an operation 320, the remaining primary inputs to the signal flow graph 100 are examined to determine if any of the remaining vertices connected to any primary inputs remain to be analyzed. If any of the remaining vertices are connected to any primary inputs, then the method operation continues in an operation 325. In operation 325 a subsequent vertex connected to a primary input of the signal flow graph 100 is selected. By way of example, if in operation 310, vertex V1 was selected, then in operation 320, vertex V3 would remain to be analyzed and in operation 325, vertex V3 would be selected and the method operations would continue in operation 315 as described above.

If in operation 320, there are no vertices connected to any primary inputs remaining to be analyzed, then the method operation continues in an operation 330. In operation 330, a final pruned signal flow graph is output and the method operations can end.

Figure 4A:
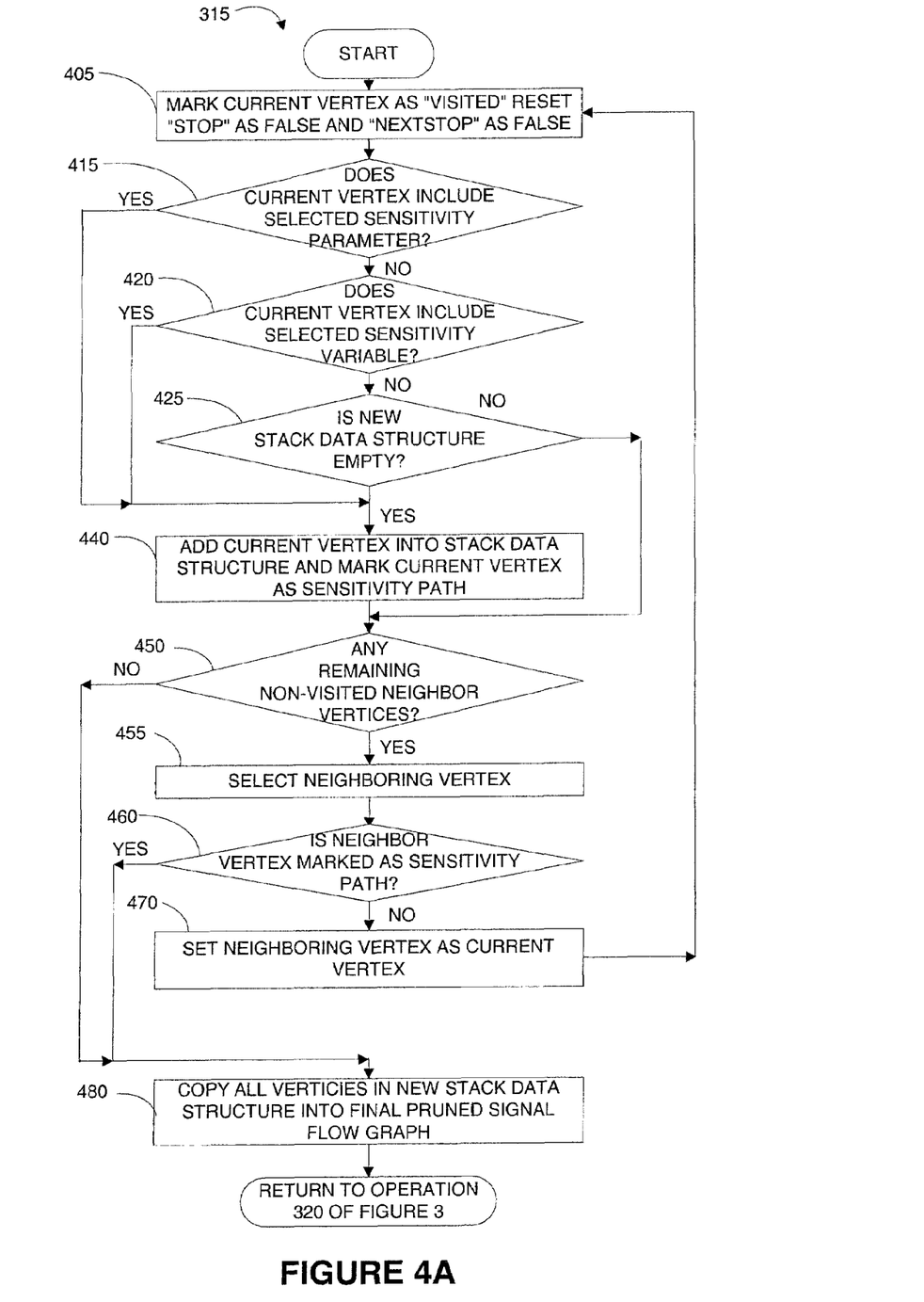
FIG. 4A is a flowchart diagram that illustrates the method operations performed in traversing the signal flow graph, in accordance with an embodiment of the present invention.

FIG. 4A is a flowchart diagram that illustrates the method operations 400 performed in traversing the signal flow graph 100, in accordance with an embodiment of the present invention. A single traversal can be a forward or reverse direction traversal. A forward direction traversal is described herein but one skilled in the art would readily understand that a reverse direction traversal could similarly be used. In an operation 405, the currently selected vertex connected to the primary input is flagged or marked as visited and a Stop flag and a NextStop flag are reset to a false condition.

In an operation 415, the current vertex is analyzed to determine of the current vertex includes a selected sensitivity parameter. If the current vertex includes the selected sensitivity parameter, then the method operations continue in an operation 440 as described below.

In the alternative, if the current vertex does not includes the selected sensitivity parameter, then the method operations continue in an operation 420 the current vertex is analyzed to determine of the current vertex includes a selected sensitivity variable. If the current vertex includes the selected sensitivity variable, then the method operations continue in an operation 440 as described below.

In the alternative, if the current vertex does not include the selected sensitivity variable, then the method operations continue in an operation 425. In operation 425, the new stack data structure is analyzed. If the new stack data structure is empty then the method operations continue in operation 440 as described below. If the new stack data structure is not empty, then the method operations continue in an operation 475 as described in more detail below.

In an operation 440, the current vertex is added to the new stack data structure. The current vertex is added to the new stack data structure so that it is identified as a vertex that is connected to a primary input and that it has been analyzed and is part of a sensitivity path.

Figure 4B:
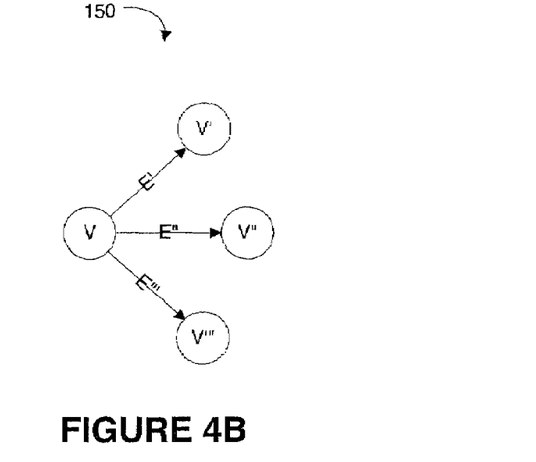
FIG. 4B is a simplified diagram of neighboring vertices, in accordance with an embodiment of the present invention.

In an operation 445, a second vertex that is a neighbor vertex to the current vertex, is selected. FIG. 4B is a simplified diagram of neighboring vertices, in accordance with an embodiment of the present invention. Referring now to FIGS. 4A and 4B, in operation 445, if vertex V is the current, then vertices V', V" and V'" are neighboring vertices as there are no intervening vertices. Vertices V', V" and V'" are connected to vertex V by corresponding edged E', E" and E'". Referring now to FIG. 1, the vertices V1-V9 are grouped in neighboring groups 102-116. By way of example, the neighbor vertices to vertex V6 are vertex V7 in group 114 and vertex V8 in group 112.

Referring again to FIG. 4A, in an operation 450, the remaining, non-visited vertices are examined to determine if any of the non-visited vertices are neighboring to the current vertex. If none of the non-visited vertices are neighboring to the current vertex or if there are no remaining non-visited vertices, then the method operations continue in an operation 480 as described below.

If one of the remaining non-visited vertices are neighboring the current vertex, then the method operations continue in an operation 455. In operation 455, the neighboring vertex is selected.

In an operation 460, the selected neighbor vertex is analyzed to determine if the neighbor vertex is marked as a sensitivity path. If the neighbor vertex is marked as a sensitivity path then the method operations continue in operation 480 as described below. If the neighbor vertex is not marked as a sensitivity path then the method operations continue in an operation 470. In operation 470, the neighbor vertex is set to the current vertex and the method operations continue in operation 405 as described above.

The method operations 405-470 repeat recursively for each sensitivity parameter and each sensitivity variable until all of the vertices in the signal flow path 100 are analyzed as being part of a sensitivity path or not.

In operation 480, the vertices stored in the new stack data structure in the iterations of operation 440 above are copied into the final pruned signal flow graph and the method operation return to operation 320 of FIG. 3. As a result of the pruning scheme described in FIG. 4, all of the vertices in the signal flow path 100 are analyzed as being part of a sensitivity path or not. Those vertices that do not contain nor affect a sensitivity parameter or a sensitivity variable are pruned out in a single pass of the signal flow path 100.

Figure 5:
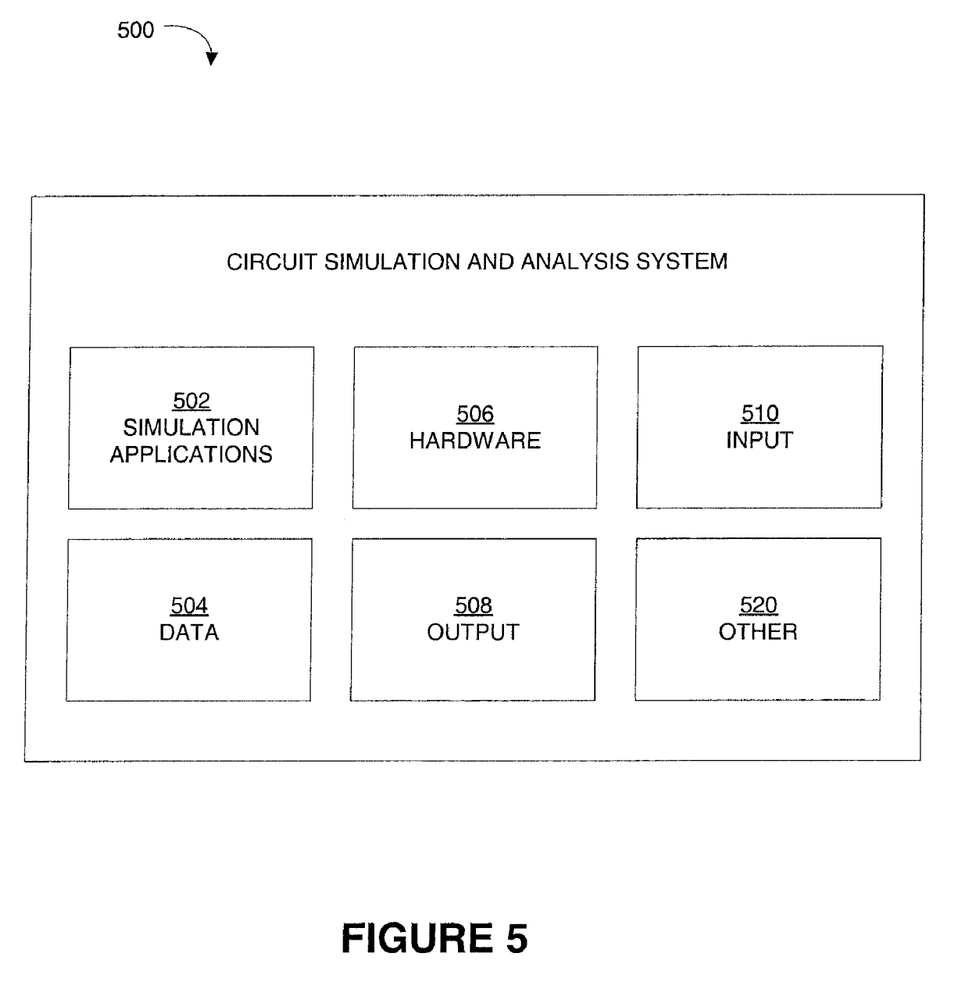
FIG. 5 is a simplified block diagram of a simulation system, in accordance with an embodiment of the present invention.

FIG. 5 is a simplified block diagram of a simulation system 500, in accordance with an embodiment of the present invention. The simulation system 500 includes a hardware portion 506 that includes the computer and memory and related hardware needed to host the simulation processing. The simulation system 500 also includes one or more simulation applications 502. The simulation application 502 can include embodiments of the present invention embodied on computer readable media or as logic circuits or combinations thereof.

The simulation system 500 also includes simulation data 504, one or more input devices 510 and output devices 508. The simulation data 504 includes the data needed to perform a circuit simulation and the results of the circuit simulation and/or the analysis. The input devices 510 and output devices 508 allow the data and results to be input and output from the simulation system 500. The simulation system 500 can also include additional hardware and/or software portions 520 to enable or enhance the circuit simulation processes.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations. An exemplary structure for the invention is described below.

Figure 6:
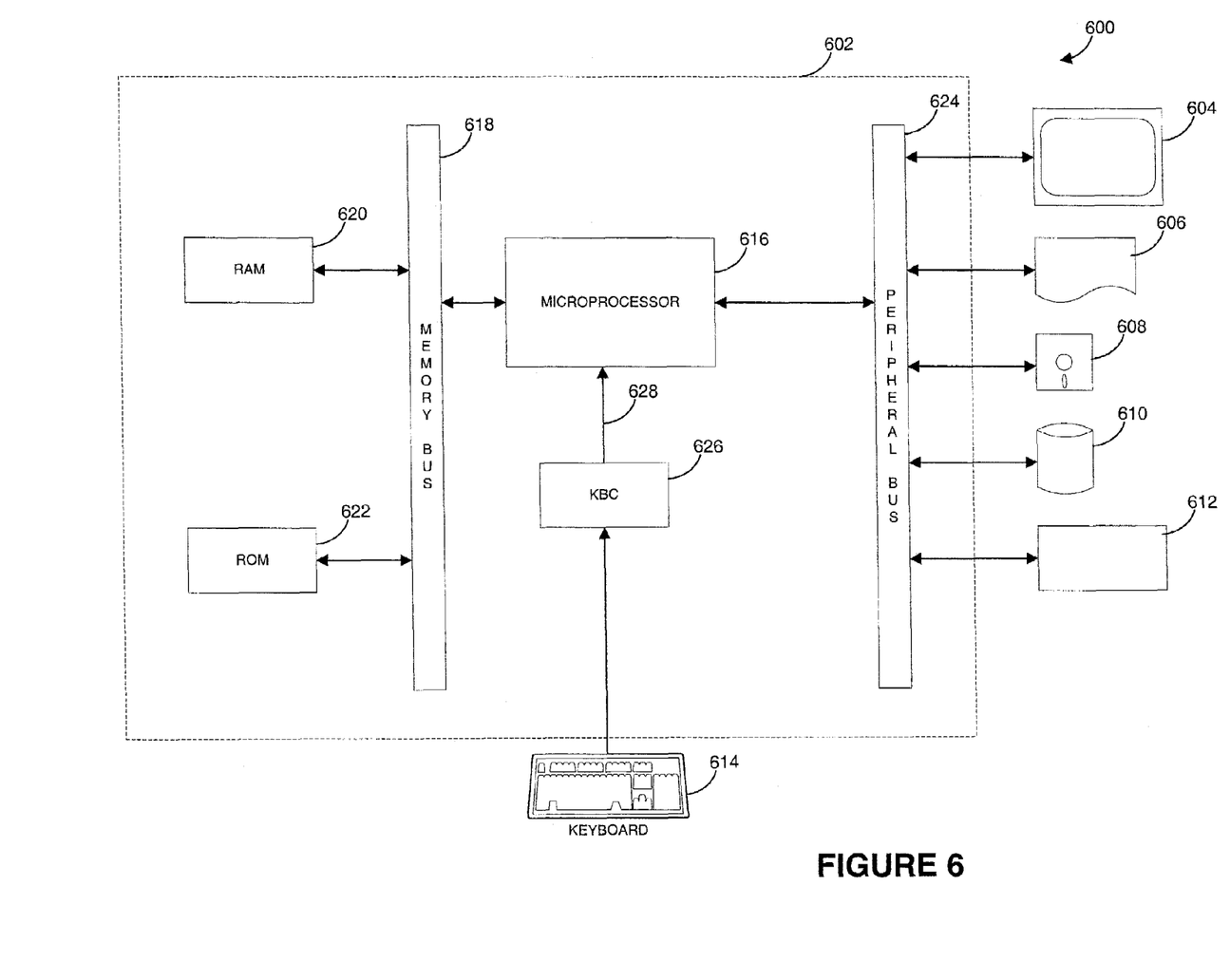
FIG. 6 is a block diagram of an exemplary computer system for carrying out the processing according to the invention.

FIG. 6 is a block diagram of an exemplary computer system 600 for carrying out the processing according to the invention. The computer system 600 can be part of the hardware portion 506 of the simulation system 500 described in FIG. 5 above. The computer system 600 includes a digital computer 602, a display screen (or monitor) 604, a printer 606, a floppy disk drive 608, a hard disk drive 610, a network interface 612, and a keyboard 614. The digital computer 602 includes a microprocessor 616, a memory bus 618, random access memory (RAM) 620, read only memory (ROM) 622, a peripheral bus 624, and a keyboard controller (KBC) 626. The digital computer 602 can be a personal computer (such as an IBM compatible personal computer, a Macintosh computer or Macintosh compatible computer), a workstation computer (such as a Sun Microsystems or Hewlett-Packard workstation), or some other type of computer.

The microprocessor 616 is a general-purpose digital processor, which controls the operation of the computer system 600. The microprocessor 616 can be a single-chip processor or can be implemented with multiple components. Using instructions retrieved from memory, the microprocessor 616 controls the reception and manipulation of input data and the output and display of data on output devices.

The memory bus 618 is used by the microprocessor 616 to access the RAM 620 and the ROM 622. The RAM 620 is used by the microprocessor 616 as a general storage area and as scratch-pad memory, and can also be used to store input data and processed data. The ROM 622 can be used to store instructions or program code followed by the microprocessor 616 as well as other data.

The peripheral bus 624 is used to access the input, output, and storage devices used by the digital computer 602. In the described embodiment, these devices include the display screen 604, the printer device 606, the floppy disk drive 608, the hard disk drive 610, and the network interface 612. The keyboard controller 626 is used to receive input from keyboard 614 and send decoded symbols for each pressed key to microprocessor 616 over bus 628.

The display screen 604 is an output device that displays images of data provided by the microprocessor 616 via the peripheral bus 624 or provided by other components in the computer system 600. The printer device 606, when operating as a printer, provides an image on a sheet of paper or a similar surface. Other output devices such as a plotter, typesetter, etc. can be used in place of, or in addition to, the printer device 606.

The floppy disk drive 608 and the hard disk drive 610 can be used to store various types of data. The floppy disk drive 608 facilitates transporting such data to other computer systems, and hard disk drive 610 permits fast access to large amounts of stored data.

The microprocessor 616 together with an operating system operate to execute computer code and produce and use data. The computer code and data may reside on the RAM 620, the ROM 622, or the hard disk drive 610. The computer code and data could also reside on a removable program medium and loaded or installed onto the computer system 600 when needed. Removable program media include, for example, CD-ROM, PC-CARD, floppy disk and magnetic tape.

The network interface 612 is used to send and receive data over a network connected to other computer systems. An interface card or similar device and appropriate software implemented by the microprocessor 616 can be used to connect the computer system 600 to an existing network and transfer data according to standard protocols.

The keyboard 614 is used by a user to input commands and other instructions to the computer system 600. Other types of user input devices can also be used in conjunction with the present invention. For example, pointing devices such as a computer mouse, a track ball, a stylus, or a tablet can be used to manipulate a pointer on a screen of a general-purpose computer.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data that can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of analyzing a circuit simulation comprising:
    pruning a signal flow graph including:
        selecting a current vertex from a plurality of input vertices in the signal flow graph, wherein each one of the plurality of the input vertices is connected to a primary input of the signal flow graph;
        determining if the current vertex includes at least one of a sensitivity parameter or a sensitivity variable, wherein if the current vertex includes at least one of a sensitivity parameter or a sensitivity variable then:
            identifying the current vertex as being part of a sensitivity path; and
            adding the current vertex to a first sub-group of vertices; and determining if any remaining non-visited neighbor vertices remain to be analyzed, wherein if any remaining non-visited neighbor vertices remain to be analyzed then:
  selecting a neighboring vertex; and
  determining if the selected neighbor vertex is identified as a sensitivity path, wherein if the selected neighbor vertex is identified as a sensitivity path, then the first sub-group of vertices are output into a final pruned signal flow graph.

2. The method of claim 1, wherein if the current vertex does not include at least one of a sensitivity parameter or a sensitivity variable then determining if the first sub-group of vertices is empty and if the first sub-group of vertices is empty then adding the current vertex to the first sub-group of vertices.

3. The method of claim 2, further comprising determining if any remaining non-visited neighbor vertices remain to be analyzed.

4. The method of claim 1, wherein if no remaining non-visited neighbor vertices remain to be analyzed then the first sub-group of vertices are output into the final pruned signal flow graph.

5. The method of claim 1, wherein if the selected neighbor vertex is not identified as a sensitivity path, then the neighboring vertex is set as the current vertex.

6. The method of claim 1, wherein the neighbor vertex includes a second vertex connected to the current vertex with no intervening vertices.

7. The method of claim 1, wherein the signal flow graph is pruned in a single direction traversal of the signal flow graph.

8. The method of claim 7, wherein the single direction traversal of the signal flow graph is a forward traversal of the signal flow graph.

9. The method of claim 1, further comprising:
  inputting a netlist to a simulation;
  decomposing the netlist;
  building an ordered signal flow graph from the decomposed netlist; and
  pruning the signal flow graph iteratively for each one of the plurality of input vertices; and
  outputting the final pruned signal flow graph.

10. A method of analyzing a circuit simulation comprising:
  inputting a netlist to a simulation;
  decomposing the netlist;
  building an ordered signal flow graph from the decomposed netlist; and
  pruning the signal flow graph iteratively for each one of the plurality of input vertices, wherein the signal flow graph is pruned in a single forward direction traversal of the signal flow graph including:
  selecting a current vertex from a plurality of input vertices in the signal flow graph, wherein each one of the plurality of the input vertices is connected to a primary input of the signal flow graph;
  determining if the current vertex includes at least one of a sensitivity parameter or a sensitivity variable, wherein if the current vertex includes at least one of a sensitivity parameter or a sensitivity variable then:
    identifying the current vertex as being part of a sensitivity path; and
    adding the current vertex to a first sub-group of vertices; and
  determining if any remaining non-visited neighbor vertices remain to be analyzed, wherein if any remaining non-visited neighbor vertices remain to be analyzed then:
    selecting a neighboring vertex; and
    determining if the selected neighbor vertex is identified as a sensitivity path, wherein if the selected neighbor vertex is identified as a sensitivity path, then the first sub-group of vertices are output into a final pruned signal flow graph; and outputting the final pruned signal flow graph.

11. A circuit simulation and analysis system comprising:
  a hardware portion to support the simulation, the hardware including:
    a microprocessor;
    a storage medium capable of storing data and microprocessor readable instructions including a plurality of applications;
  logic for pruning a signal flow graph including:
    logic for selecting a current vertex from a plurality of input vertices in the signal flow graph, wherein each one of the plurality of the input vertices is connected to a primary input of the signal flow graph;
    logic for determining if the current vertex includes at least one of a sensitivity parameter or a sensitivity variable, wherein if the current vertex includes at least one of a sensitivity parameter or a sensitivity variable then:
      identifying the current vertex as being part of a sensitivity path; and
      adding the current vertex to a first sub-group of vertices; and
    logic for determining if any remaining non-visited neighbor vertices remain to be analyzed, wherein if any remaining non-visited neighbor vertices remain to be analyzed then:
      selecting a neighboring vertex; and
      determining if the selected neighbor vertex is identified as a sensitivity path, wherein if the selected neighbor vertex is identified as a sensitivity path, then the first sub-group of vertices are output into a final pruned signal flow graph.

12. The system of claim 11, wherein if the current vertex does not include at least one of a sensitivity parameter or a sensitivity variable then determining if the first sub-group of vertices is empty and if the first sub-group of vertices is empty then adding the current vertex to the first sub-group of vertices.

13. The system of claim 12, further comprising determining if any remaining non-visited neighbor vertices remain to be analyzed.

14. The system of claim 11, wherein if no remaining non-visited neighbor vertices remain to be analyzed then the first sub-group of vertices are output into the final pruned signal flow graph.

15. The system of claim 11, wherein if the selected neighbor vertex is not identified as a sensitivity path, then the neighboring vertex is set as the current vertex.

16. The system of claim 11, wherein the neighbor vertex includes a second vertex connected to the current vertex with no intervening vertices.

17. The system of claim 11, wherein the signal flow graph is pruned in a single direction traversal of the signal flow graph.

18. The system of claim 17, wherein the single direction traversal of the signal flow graph is a forward traversal of the signal flow graph.

19. The system of claim 11, further comprising:
  an input portion;
  logic for inputting a netlist to a simulation;
  logic for decomposing the netlist;

logic for building an ordered signal flow graph from the decomposed netlist; and logic for pruning the signal flow graph iteratively for each one of the plurality of input vertices;

an output portion; and logic for outputting the final pruned signal flow graph.

* * * * *